United States Patent [19]

Fisher

[11] Patent Number: 4,873,176
[45] Date of Patent: Oct. 10, 1989

[54] RETICULATION RESISTANT PHOTORESIST COATING

[75] Inventor: Thomas A. Fisher, Cambridge, Mass.

[73] Assignee: Shipley Company Inc., Newton, Mass.

[21] Appl. No.: 90,753

[22] Filed: Aug. 28, 1987

[51] Int. Cl.$^4$ .................. G03F 7/26; H01L 21/312
[52] U.S. Cl. .................................. 430/313; 430/191; 430/192; 430/314; 430/323; 430/326; 156/643; 437/228; 437/229
[58] Field of Search .............. 430/313, 314, 323, 326, 430/192, 191; 156/643; 437/228, 229

[56] References Cited

U.S. PATENT DOCUMENTS

| | | | |
|---|---|---|---|
| 4,259,430 | 3/1981 | Kaplan et al. | 430/191 |
| 4,387,013 | 6/1983 | Lehmann et al. | 156/643 |
| 4,468,284 | 8/1984 | Nelson | 156/643 |
| 4,524,121 | 6/1985 | Gleim et al. | 430/326 |
| 4,581,321 | 4/1986 | Stahlhofen | 430/191 |
| 4,596,763 | 6/1986 | DiCarlo et al. | 430/192 |
| 4,600,683 | 7/1986 | Greco et al. | 430/176 |
| 4,600,686 | 7/1986 | Meyer et al. | 430/326 |
| 4,690,838 | 9/1987 | Hiroaka et al. | 430/324 |

FOREIGN PATENT DOCUMENTS 60-154248  8/1985  Japan ................... 430/191

OTHER PUBLICATIONS

Anon, *Research Disclosure*, #279, 7/1987.
Kalter, H. et al. *Phillips Technical Review*, vol. 38, 1978/79, No. 7/8, pp. 202-210.
Horada, K., Journal of the Electrochemical Society, Solid State Science & Technology, vol. 127, No. 2, 2/1980, pp. 491-497.

*Primary Examiner*—Charles L. Bowers, Jr.
*Attorney, Agent, or Firm*—Robert L. Goldberg

[57] ABSTRACT

The invention provides a method for forming a photoresist mask on a substrate resistant to reticulation during plasma etching. The method comprises the steps of forming an imaged and developed photoresist coating over an integrated circuit substrate where the photoresist contains an essentially unreacted acid activated cross linking agent, and subjecting said substrate to an etching plasma in a gaseous stream that contains a Lewis acid. Contact of the surface of the photoresist film with the Lewis acid causes cross linking of the surface of the photoresist film during plasma etching with the formation of a reticulation resistant surface layer.

7 Claims, 1 Drawing Sheet

RETICULATION RESISTANT PHOTORESIST COATING

BACKGROUND OF THE INVENTION

1. Introduction

This invention relates to a method for reducing photoresist reticulation during plasma etching, and more particularly, to plasma etching a reticulation resistant photoresist in a method for the manufacture of a semiconductor device.

2. Description of the Prior Art

Plasma etching is a technique well known in the art and commonly used in the manufacture of semiconductors. An article describing plasma etching is entitled "Plasma Etching In IC Technology" by Kalter and Van der Ven, which appeared at pages 202-210 of *Philips Technical Review*, Volume 38, 1978/79, No. 7/8.

Radiation sensitive photoresists commonly used in the semiconductor industry are sensitive to different forms of radiation. For example, some photoresists are sensitive to visible light and some to x-rays, while others are sensitive to radiation in the form of beams of charged particles such as electrons. By using a lithographic procedure that involves exposure to the appropriate radiation followed by development in a suitable developer, a photoresist film on a surface can be patterned to form a mask which is resistant to a subsequent plasma etching treatment.

Radiation sensitive photoresists are classified as positive or negative acting. When a positive acting photoresist is exposed to radiation, the exposed parts can be removed selectively because they become soluble in a developing solution while the unexposed parts remain insoluble. With a negative acting photoresist, the exposed parts become insoluble while the unexposed parts remain soluble. In general, positive acting photoresists provide better image resolution than their negative acting counterparts. For this reason, because of a continuing desire for increasing miniaturization, the semiconductor industry has tended to prefer positive acting photoresists for the manufacture of integrated circuits. However, photoresists offer poor resistance to plasma etching as demonstrated by wrinkling or roughening of the photoresist surface—a condition referred to in the art as reticulation. Reticulation is undesirable as it can result in an unacceptable variation in the fabrication of a metal profile.

Various methods have been proposed to counteract the poor resistance of photoresists to plasma etching. One method proposes the use of a layer of photoresist in the range of from about 1.0 to 2.0 micrometers in thickness to compensate for undesirable erosion. However, image resolution is reduced as photoresist thickness increases and high resolution is required for semiconductor manufacture.

Others in the art have devised different plasma etching systems and new photoresist materials in an effort to improve reticulation resistance of a photoresist to plasma etching while retaining the benefit of high resolution. For example, in a paper authored by Harada, "Additives That Improve Positive Resist Durability For Plasma Etching," *Journal of the Electrochemical Society; Solid State Science and Technology*, Volume 127, No. 2, Feb. 19, 1980, pages 491 to 497, Harada claims that the etch resistance of conventional positive photoresists can be improved by including an additive such as a radical scavenger or a free radical, e.g. 1,1 - diphenyl - 2-picrylhydrazl and galvinoxyl, or a plastics antioxidant such as 2,4,6 -tritert - butyl phenol. Though Harada's technique increases etch resistance, the increase is at the expense of other important photoresist properties such as photoresist sensitivity.

Another method attempted in the prior art to improve the reticulation resistance of an imaged photoresist involving the use of additives is disclosed in U.S. Pat. No. 4,581,321 incorporated herein by reference. In this patent, in addition to the usual photoresist components, the formulation contains an acid catalyzed cross-linking agent and an acid release compound that releases acid such as by photolysis. Upon exposure of the photoresist coating to activating radiation in an image pattern, photolysis results in the release of the acid. The acid catalyzes the cross-linking agent resulting in some cross-linking or hardening of the photoresist. However, the cross-linking that occurs is inadequate to provide sufficient reticulation resistance to the high temperatures generated during plasma etching. Consequently, subsequent to development of the photoresist image and prior to plasma etching, it is necessary to increase the number of cross links such as by a high temperature bake at temperatures of at least 130° C. for, for example, 30 minutes, followed by a deep u.v. (<330 nm) flooding of the resist surface. Though this method does provide a developed photoresist with improved thermal resistance, the additional step of a high temperature bake or u.v. flooding increases processing time and consequently, processing costs. Moreover, during the high temperature bake or the u.v. flood, the photoresist, which is not intended to be a permanent coating over the substrate, becomes firmly adhered to the substrate and insoluble in strippers conventionally used to remove a developed photoresist from a substrate. Consequently, removal of the photoresist from the substrate following plasma etching may be a significant problem when reticulation resistance is increased by a cross-linking mechanism as described in the patent.

Another process for increasing reticulation resistance of a photoresist is disclosed in U.S. Pat. No. 4,600,686, incorporated herein by reference. In accordance with the teaching of this patent, a photoresist coating is formed over a substrate employing materials and processing steps well known in the semiconductor industry. An etch resistant surface layer or skin is formed over the photoresist to reduce plasma attack on the photoresist mask so that, as stated by the patentee, thinner resist films such as less than 0.25 micrometers can be used for increased resolution. The process comprises forming the imaged photoresist layer over the substrate and then sputtering a layer of chromium onto the imaged resist surface. The thickness of the sputtered chromium coating varies typically between 50 and 100 angstroms. Following sputtering of the chromium onto the photoresist coating, the photoresist is chemically reacted with the chromium by heating the photoresist to a temperature of approximately 130° C. for 30 minutes. The skin formed over the photoresist is resistant to subsequent plasma etching. The chromium surface may be etched in a plasma containing one part carbon tetrachloride to one part oxygen in three parts of a carrier gas such as argon or carbon monoxide. Following etching, the patterned photoresist film, together with the skin, are removed using fuming nitric acid. Though the method described in this patent does improve resistance of the resist to plasma etching, the steps of chromium sputtering, baking and nitric acid dissolution of the chromium are required. Such steps increase processing time and expense.

SUMMARY OF THE INVENTION

The subject invention provides a means for rendering the surface of a photoresist mask resistant to reticulation during certain plasma etching processes.

The process of the subject invention is based upon the discovery that an imaged photoresist film containing an essentially unreacted acid catalyzed cross-linking agent will generate a reticulation resistant surface layer or skin over the photoresist film when the substrate is etched with a plasma that contains or generates a Lewis acid. To practice the process of the invention, a photoresist containing the acid catalyzed cross-linking agent is coated onto a substrate in a conventional manner and processed to yield a developed image that serves as a mask for etching. Thereafter, without the requirement for a high temperature bake or a u.v. flood or any other preliminary treatment step, the substrate is etched with a plasma that contains or generates a Lewis acid. The Lewis acid causes cross-linking of the surface layer of the photoresist film which cross-linked surface layer provides reticulation resistance. Significant cross-linking does not occur within the photoresist layer since the interior of the photoresist layer is not exposed to the Lewis acid.

The plasma may contain the Lewis acid as one of its constituents, or the Lewis acid may be generated as a consequence of the etching reaction. For example, aluminum trichloride, a Lewis acid, is generated when aluminum over a silicon dioxide substrate is etched with a plasma of boron trichloride and chlorine gas in a suitable carrier gas.

The process of the subject invention is an improvement over processes of the prior art such as those described above. Fewer processing steps are required because a high temperature bake or u.v. flood is not required. Since the cross-linking reaction does not take place throughout the entire photoresist layer and a high temperature bake step is not used, following the step of etching, the photoresist is readily removed by contact with a conventional photoresist stripper.

DESCRIPTION OF THE PREFERRED EMBODIMENTS

Figure 1:
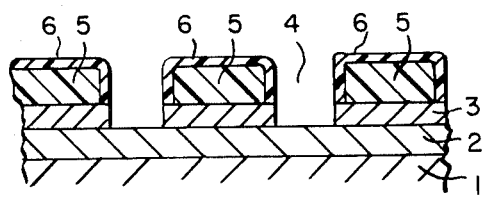
FIG. 1 is a pictorial representation of the cross section of an integrated circuit following plasma etching having a photoresist image with a hardened or cross linked surface formed in accordance with the process of the invention.

The photoresists of this invention are conventional photoresist materials containing an acid catalyzed cross-linking agent. Preferred photoresists of the invention comprise, as major components, an alkali soluble resin binder, an o-quinone diazide sulfonic acid ester photoactive compound, and an acid catalyzed cross-linking agent, all dissolved in a suitable solvent.

The alkali soluble resin binder most frequently used in the formation of positive working photoresist compositions are the novolak resins well known in the art and described in various publications including Chemistry and Application of Phenolic Resins, Knop and Scheib, Springer Verlag, New York, 1979, Chapter 4, incorporated herein by reference. These resins are formed by the condensation of formaldehyde with a phenol, preferably a cresol under conditions that form a thermoplastic polymer. Another class of resins used for the formation of positive working photoresist compositions are the polyvinyl phenols as disclosed in U.S. Pat. No. 3,869,292, also incorporated herein by reference. Both resins are suitable for purposes of this invention, though the novolak resins are preferred. Those novolak resins formed by condensation of formaldehyde with a phenol are most preferred.

The photoactive o-quinone diazide sulfonic acid esters used in the photoresists of this invention are also well known in the art and disclosed in Light Sensitive Systems, Kosar, John Wiley and Sons, New York, 1965, Chapter 7, incorporated herein by reference. The preferred materials are substituted naphthoquinone diazide sulfonic acid esters conventionally used for the formation of positive working photoresists. Such photoactive compounds are disclosed in U.S. Pat. Nos. 3,106,465; 3,148,983; 3,130,047; 3,201,329; 3,785,825 and 3,802,885, all incorporated herein by reference. The more preferred photoactive compounds are naphthoquinone-(1,2)-diazide-5-sulfonyl chloride and naphthoquinone-(1,2)-diazide-4-sulfonyl chloride condensed with a phenolic compound. The most preferred photoactive compounds are the naphthoquinone-(1,2)-diazide-5-sulfonyl chloride condensed with a trihydroxybenzophenone and most preferably, condensed with the product of reduction of a trihydroxybenzophenone.

A further component of the photoresist composition of the subject invention is an acid activated cross-linking agent capable of cross-linking the binder at elevated temperatures in the presence of an acid. Preferred cross-linking agents for purposes of this invention comprise ethers of hexamethylol melamine. In general, the alkyl ether groups of the hexamethylol melamine ethers used in accordance with the invention have from 1 to 10 and preferably from 1 to 4 carbon atoms. Methyl ethers are preferred. The hexamethylol melamines can be completely or partially etherified. Partially etherified products which may be used include, in particular, technical grade mixtures of components having different degrees of etherification. The hexaalkyl ethers are usually preferred over the partially etherified compounds.

In addition to the binder, photoactive compound and cross-linking agent, as should be apparent to those skilled in the art, other additives may be included in the photoresist formulation. For example, other resins may be added to the photoresist such as epoxy resins and vinyl polymers, such as polyvinyl acetates, polyacrylates, polyvinyl acetals, polyvinyl ethers, polyvinyl pyrrolidones and co-polymers of the monomers on which these materials are based, as well as hydrogenated or partially hydrogenated colophony derivatives. To meet special requirements such as flexibility, adhesion, gloss and coloration, the photoresist may contain additional materials such as polyglycols; cellulose derivatives, such as ethylcellulose; surfactants; dyes; adhesion promoters; and ultraviolet absorbers, if desired.

In accordance with one embodiment of the invention, the photoresist is in the form of a liquid coating composition. The coating composition is formed by dissolving the photoresist components in a suitable solvent. The selection of the solvent should be matched to the coating process to be used, the desired thickness of the photoresist layer and drying conditions. Suitable solvents for the composition of the present invention include ketones such as methylethyl ketones; chlorinated hydrocarbons, such as trichloroethylene and 1,1,1-trichloroethane; alcohols, such as n-propanol, ethers such as tetrahydrofuran; alcohol-ethers, such as ethylene glycol monomethyl ether; and alcohol-ether acetates, such as ethylene glycol monoethyl ether acetate and propylene glycol monomethyl ether acetate. Preferred for purposes of this invention are the ether acetates of glycols, especially propylene glycol monomethyl ether acetate.

A photoresist coating composition is formed by dissolving the above identified photoresist components in one or more of the aforesaid solvents. The total solvents content of the photoresist composition should vary between 60 and 68 percent by weight and more preferably, between 65 and 72 percent by weight. Of the solids, the binder (resin) should comprise from about 30 to 90 percent by weight of the total solids content, and more preferably, from about 55 to 85 percent of the solids; the photoactive compound should comprise from about 8 to 32 percent of the total solids and more preferably, from 17 to 27 percent of the solids content; and the cross linking agent should comprise from about 2 to 18 percent of the total solids content, and more preferably, from about 5 to 14 percent of the solids. Other additives would be used in their conventional concentration. The presence of other additives in the composition would proportionately reduce the concentration of the binder, photoactive compound and cross-linking agent.

The photoresists of the invention are applied to a substrate in accordance with art recognized procedures. For example, the photoresist may be applied by spin-coating, spraying, dipping, roller-coating or other means known to the art. Light sources customary in the industry are used for exposure. Irradiation with electrons or laser is also a suitable means for producing an image.

The photoresists are applied over a substrate capable of dry etching with plasma. The photoresists are especially useful for the formation of microprocessors and other miniaturized integrated circuit components, and substrates typically include silicon/silicon dioxide wafers, aluminum (including aluminum alloys such as alloys with copper, gold and silicon/silicon dioxide wafers, gallium/arsenide wafers and other wafers typically employed in the art. The wafers preferred for purposes of the invention are metal coated silicon dioxide capable of generating a Lewis acid when etched with a suitable plasma. Aluminum/silicon dioxide wafers are most preferred for the process of the invention because aluminum evaporates in the plasma and reacts with chlorine to form the Lewis acid.

The process for using the photoresist of the invention is believed to be novel though many steps of the process are conventional. The resist is coated over a suitable substrate in conventional manner and baked in a convection oven at a relatively low temperature (soft baked) to remove the bulk of the solvent from the photoresist. The soft bake step is conventional. Typical soft bake conditions in a convection oven comprise a temperature of from about 80° to 110° C. for a bake time of from about 15 minutes to 45 minutes. An alternative to the soft bake process is a hot plate bake at a temperature ranging between 100° and 140° C. for from 45 to 90 seconds. The film remaining following baking is essentially free of solvent and has a thickness varying between about 1 and 5 microns.

The coated substrate is then imagewise exposed to radiation in the near (about 450 to about 330 nm) to mid (about 330 to about 280 nm) ultraviolet ranges of the spectrum, preferably the near ultraviolet region, in a desired exposure pattern produced with a suitable mask, stencil, template, or the like. The photoresist may be exposed using commercially available equipment, for example, a Perkin-Elmer 1:1 Projection Micralign 340 Model.

Following exposure, the photoresist coated substrate is contacted with an aqueous alkaline developer, preferably by immersion in the developing solution, until all of the exposed photoresist coating has been dissolved from the imaged areas. The developer formulation used to develop the imaged photoresist film is not critical, and a developer suitable for use with the photoresists of the invention is an aqueous alkaline solution containing surfactants, preferably an aqueous metal ion free solution of a tetra alkyl ammonium hydroxide. Such developers are known in the art and commercially available. Typical development conditions comprise immersion in the developer at a temperature of between about 20° and 25° C. with the development time dependent upon exposure energy, developer strength, developer mode such as spray, puddle, nitrogen burst submersion or mechanical agitation, and pre-bake temperature. Development is in accordance with art recognized procedures. Following development, the developed wafers are typically rinsed with deionized water.

The process steps outlined above for forming a developed photoresist image over a wafer are conventional. The next step in a conventional process utilizing an acid hardenable or cross linkable resist might comprise a u.v. flood and to photolyze an acid release compound and a post development heat treatment step (hard bake) at a temperature of in excess of 110° C. for about 15 to about 45 minutes, and more typically, at about 120° C. for about 40 minutes. The purpose of this step for such a resist would be to remove residual solvent and cross link the resist to render the developed image more resistant to subsequent processing.

In contrast to the prior art processes described above, the process of the subject invention does not require a post development (hard bake) heat treatment step coupled with a u.v. flood. Though a hard bake step may be used, preferably, following development and rinsing, the next step in the process of the subject invention would be plasma etching. Plasma etching is an etching process conventionally used in microcircuit fabrication. The use of plasmas, including the use of plasmas for microcircuit fabrication and substrate etching is disclosed by Boenig, Plasma Science and Technology, Cornell University Press, Ithaca and London, 1982, pages 277 to 289, incorporated herein by reference. The use of plasmas for etching aluminum is disclosed by Krogh et al, J. Electrochem. Soc.: Solid State Science and Technology, Vol. 134, No. 8, pp. 2045 to 2048, August, 1987, incorporated herein by reference.

As is known, plasma etching involves contact of a surface to be treated with an ionized stream of a reactive gas for purposes including the etching of conventional integrated circuit substrates such as those enumerated above. The plasma stream typically comprises an inert carrier gas such as helium or nitrogen and a reactive gas capable of etching the substrate, typically a halogen containing gas such as carbon tetrachloride, boron trichloride, silicon tetrachloride, etc. Contact of the plasma with the integrated circuit substrate results in a reaction between the plasma gas and the substrate with evolution of a reaction product in the form of a vapor such as, for example, aluminum trichloride when the reactive gas is chlorine and the integrated circuit substrate is aluminum.

Plasma etching of an integrated circuit substrate coated with a resist image causes erosion of the photoresist film and reticulation. As described above, the remedial measures employed by the prior art to avoid damage to the photoresist film include cross linking the photoresist image prior to plasma etching, vapor deposition of a metallic barrier layer, etc. Cross linking hardens the photoresist film throughout its cross section and also results in formation of a strong bond between the photoresist and the substrate over which it is coated. The cross linking of the photoresist throughout its cross section further results in insolubilization of the imaged photoresist film in conventional photoresist strippers. This made stripping of the photoresist film from the integrated circuit substrate difficult and time consuming.

The subject invention overcomes the problems described above by beneficially using the chemical properties of the plasma stream and/or the properties of the etch by-products.

As described above, the imaged photoresist film of the invention contains an acid activatable cross linking agent that is, prior to plasma etching, unreacted and capable of causing cross linking of the photoresist when exposed to an acid, particularly at elevated temperature. The cross linking agent is unreacted prior to plasma etching because the process to this point in the processing sequence has not generated an acid.

The next step in the process of the subject invention is plasma etching. The plasma used to etch the integrated circuit substrate may contain a Lewis acid or alternatively, the product formed by plasma etching may itself be a Lewis acid. Regardless of how the Lewis acid is introduced into the etching environment, contact of the imaged photoresist film with the plasma containing the Lewis acid, and in part due to the heat generated by plasma etching, causes cross linking of the surface of the photoresist film to form a cross linked skin without significant cross linking occurring within the interior or throughout the cross section of the photoresist film since the interior of the film is not contacted with the Lewis acid. This results in a surface hardening of the photoresist film in situ during the etching process. The process results in sufficient cross linking to prevent reticulation of the photoresist film during the plasma etching process. The surface layer of cross linked photoresist appears to function in a manner analogous to coating the photoresist film with chromium as described in U.S. Pat. No. 4,600,686 discussed above.

The structure formed by the process of the subject invention is pictorially represented in FIG. 1 of the drawings. In this figure, there is shown an integrated circuit substrate 1, such as silicon having a silicon dioxide coating 2 and a coating of aluminum 3, with etched depressions 4 and a protective photoresist film 5 over the substrate 1 which photoresist film has a hardened surface 6 due to the cross-linking reaction.

As described above, an acid is required in the etching environment to cause cross linking of the surface of the imaged photoresist film. This acid may be part of the plasma, or may be generated by the etching reaction, or both. For example, a metal halide vapor may be introduced into the plasma to provide the acid provided that additive is selected so as not to contaminate the wafer or otherwise interfere with the process. Alternatively, the acid may be formed as a consequence of the etching reaction such as when a plasma containing a halogen is used to etch a metallic substrate. For example, a plasma for etching an aluminum/silicon dioxide integrated circuit substrate would typically comprise a halide gas such as silicon tetrachloride or boron trichloride. The product formed by etching of the aluminum with this plasma would be an aluminum chloride which is a Lewis acid. The process of the invention overcomes many disadvantages of prior art processes. For example, the conventional post imaging heat treatment step/deep u.v. step of the prior art is avoided thus reducing the number of total steps in the overall process. The reduction in the number of processing steps significantly increases through-put as the post imaging heat treatment/deep u.v. step typically consumes in excess of 30 minutes. In addition, by avoidance of a post imaging heat treatment step and by avoidance of cross-linking throughout the cross section of the imaged photoresist film, the photoresist is readily stripped from the substrate using conventional photoresist strippers such as a solution of Microposit ® Remover 1165 available from Shipley Company Inc. of Newton, Mass.

DESCRIPTION OF THE BEST MODE

The best mode of carrying out the subject invention is described in the following examples.

EXAMPLE 1

A photoresist was prepared having the following composition:

| Component | Concentration |
| --- | --- |
| Resin Novolak resin with molecular weight of approximately 60,000 | 162.05 gms/liter |
| Photoactive compound 1-oxo-2-diazo-naphthoquinone-5-aryl sulfonate | 45.28 gms/liter |
| Hexamethoxymethylmelamine | 17.06 gms/liter |
| Proprietary Leveling Agent and Adhesion Promoter | 3.09 gms/liter |
| Proprietary Dye | 3.31 gms/liter |
| Solvent Mixture | to 1 liter |

For this example, a silicon substrate was used that had a 0.6 micron silicon dioxide grown layer and a 0.5 micron evaporated aluminum coating. The above resist material was spin coated onto the substrate at 4200 rpm for 30 seconds. Following coating of the photoresist onto the substrate, the coating was subjected to a 60 second bake at 120° C. The coating was applied using a SVG 86 coater and baked using a hotplate unit. The final film thickness was measured to be 1.404 microns. The resist coating was then exposed for 7 seconds to broad band mercury bulb illumination using a Cannon PLA50 1F contact printer. The imaged photoresist was developed by immersion of the substrate in a 74 percent by weight solution of Microposit ® MF 319 developer (an aqueous alkaline metal ion free solution of a quaternary ammonium hydroxide). Following development, the substrate was etched using a Lam Research Autoetch 690 etcher using a boron trichloride, chlorine and chloroform etch gas mixture with nitrogen as the carrier gas. The etch power level was 350W at a pressure of 0.250 Torr.

Figure 2:
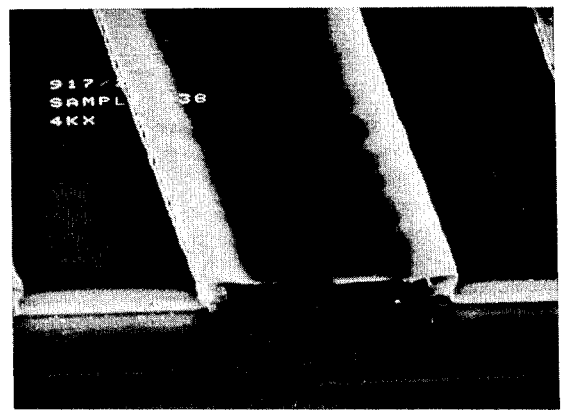
FIG. 2 is a photomicrograph of an etched integrated circuit substrate having an imaged photoresist film formed over the substrate using a photoresist that is the subject of the invention.

A wafer prepared by the above procedure was evaluated by cleaving the wafer followed by SEM analysis to obtain a photomicrograph. The photomicrograph showed a surface essentially free of reticulation and having an appearance quite similar to that shown in FIG. 2 of the drawings.

EXAMPLE 2

Figure 3:
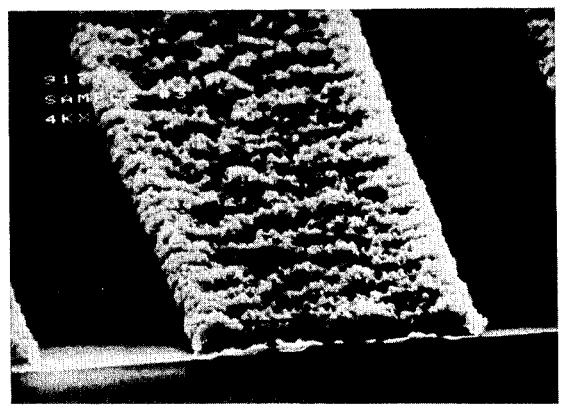
FIG. 3 is a photomicrograph of an etched integrated circuit substrate having an imaged photoresist film formed over the substrate using a prior art photoresist.

For purposes of comparison, the formulation of Example 1 was prepared without hexamethoxymethylmelamine, but was otherwise the same. The procedure of Example 1 was repeated and the analysis of the resist surface revealed excessive reticulation simililar to that shown in FIG. 3 of the drawings.

I claim:

1. A process for etching an integrated circuit substrate, said process comprising the steps of forming an imaged and developed positive working photoresist coating over said integrated circuit substrate, said photoresist prior to imaging and developing comprising a binder selected from the group of novolak resins and polyvinyl phenol resins, a photoactive naphthoquinone diazide sulfonic acid ester and an essentially unreacted acid activated cross-linking agent, and subjecting said coated substrate to an etching plasma in a gaseous stream that contains a Lewis acid during etching whereby a cross-linked surface layer is formed on said photoresist wherein the concentration of the acid activated cross-linking agent is sufficient to form a surface layer of cross-linked photoresist over the imaged photoresist film adequate to prevent significant reticulation of the photoresist image during plasma etching.

2. The process of claim 1 where the photoresist is one having a novalak resin binder.

3. The process of claim 1 where the photoresist is one having a polyvinyl phenol binder.

4. The process of claim 1 where the photoresist, prior to exposure, is a positive working photoresist comprising a novalak resin and an o-quinone diazide sulfonic acid ester.

5. The process of claim 1 where the surface of the photoresist coating is a cross linked novalak resin.

6. The process of claim 1 where the Lewis acid is an etch by-product generated during the etching step.

7. The process of claim 1 where the cross-linking agent is an ether of a hexamethylol melamine.

* * * * *